United States Patent
Rudaz

Patent Number: 5,729,029
Date of Patent: Mar. 17, 1998

[54] MAXIMIZING ELECTRICAL DOPING WHILE REDUCING MATERIAL CRACKING IN III-V NITRIDE SEMICONDUCTOR DEVICES

[75] Inventor: Serge L. Rudaz, Sunnyvale, Calif.

[73] Assignee: Hewlett-Packard Company, Palo Alto, Calif.

[21] Appl. No.: 709,355

[22] Filed: Sep. 6, 1996

[51] Int. Cl.$^6$ .................................. H01L 29/06
[52] U.S. Cl. ..................... 257/13; 257/191; 257/103
[58] Field of Search ...................... 257/13, 190, 191, 257/103, 183

[56] References Cited

U.S. PATENT DOCUMENTS

| 5,583,879 | 12/1996 | Yamazaki et al. | 257/103 |
| 5,606,185 | 2/1997 | Nguyen et al. | 257/191 |

FOREIGN PATENT DOCUMENTS

| 2-81484 | 3/1990 | Japan | 257/103 |

Primary Examiner—Jerome Jackson
Assistant Examiner—Nathan K. Kelley
Attorney, Agent, or Firm—Pamela Lau Kee

[57] ABSTRACT

N-type doping in III-V-nitride semiconductor compounds, i.e. GaN-based compounds such as GaN, AlGaN, AlInN, InGaN, or AlGaInN, can be optimized to improve N-contact electrical resistance, carrier injection, forward voltage, and recombination characteristics without inducing cracking of the device layers. The N-type layer is constructed of sub-layers such that an N-type sub-layer is provided for each desired characteristic or property. The thickness of each sub-layer is carefully selected to avoid material cracking: the higher the required doping, the smaller the corresponding thickness. In illustration, the buffer layer of a light emitting device (LED) has three sub-layers. The first sub-layer is lightly doped to avoid cracking and is grown to the desired thickness for good material quality. The second sub-layer is heavily doped to provide good N-contact and electrical resistivity characteristics and is kept correspondingly as thin as necessary to avoid material cracking. The third sub-layer is doped to the desired level to provide optimum carrier injection and pair recombination in the active layer of the device.

21 Claims, 2 Drawing Sheets

Figure 2

| 30 | |
|---|---|
| 40 | FORM BUFFER LAYER OVER SUBSTRATE |
| 50 | GROW FIRST N-TYPE SUB-LAYER FOR MATERIAL QUALITY (LOWER DOPING, HIGHER THICKNESS) |
| 60 | GROW SECOND N-TYPE SUB-LAYER FOR LOW ELECTRICAL RESISTIVITY AND LOW FORWARD VOLTAGE |
| 70 | GROW THIRD N-TYPE SUB-LAYER FOR OPTIMUM CARRIER INJECTION/RECOMBINATION AND LIGHT OUTPUT EFFICIENCY |
| 80 | FINISH GROWING LED STRUCTURE |

MAXIMIZING ELECTRICAL DOPING WHILE REDUCING MATERIAL CRACKING IN III-V NITRIDE SEMICONDUCTOR DEVICES

FIELD OF THE INVENTION

This invention relates to the manufacture of gallium-nitride-based devices. In particular, the invention is directed towards improving the electrical characteristics as well as the light extraction from gallium-nitride-based light emitting devices without incurring material cracks.

BACKGROUND OF THE INVENTION

Gallium nitride (GaN)-based compounds have wavelength emissions in the green and blue range of visible light and in the near ultra-violet. Because single crystals of gallium nitride are difficult to grow, commercial GaN substrates are unavailable for the epitaxial growth of GaN-based devices. Currently, most GaN-based light emitting devices (LEDs) are epitaxially grown on a sapphire substrate. The difference in lattice constants and in coefficients of thermal expansion between the sapphire substrate and the GaN-based semiconductors makes it difficult to grow a high quality GaN-based epitaxial layer on the sapphire substrate. Furthermore, a highly conductive P-type GaN semiconductor is nearly impossible to obtain due to combinations of high N-type background concentration and low P-type doping activity. Although the basic heterojunction device concepts have been well understood for many years, these difficulties stymied the development of efficient heterojunction lasers and LEDs emitting green or blue light using an $(Al_xGa_{1-x})_yIn_{1-y}N$ (where $0 \leq x \leq 1$ and $0 \leq y \leq 1$) material system (heretofore known as AlGaInN).

During the late 1980s, a highly efficient GaN-based LED became a possibility when researchers discovered the importance of growing GaN or AlN buffer layers at low temperatures. Growing a buffer layer on a sapphire substrate at low temperatures improves the morphology of the subsequently grown AlGaInN layer and reduces the N-type background concentration of the AlGaInN materials. This coupled with post-growth thermal annealing or low energy electron beam irradiation to activate the P-type dopants has made growing conductive P-type GaN easier. These technological advances have greatly accelerated the progress in device development of an AlGaInN material system for optoelectronics and other applications.

Recent advances have allowed the growth of good AlGaInN devices on substrates other than sapphire, although these substrates are not yet widely available commercially. New buffer material systems other than AlGaInN (such as zinc oxide ZnO) have also been used. Thick AlGaInN single crystals have been grown on silicon and sapphire wafers by hydride vapor phase epitaxy (HVPE) and subsequently used as substrates for AlGaInN device growth. Silicon carbide (SIC), ZnO, bulk GaN, and various garnets have also been used with success. These substrates usually have much better lattice matching to GaN than sapphire and may not require a preliminary buffer layer to obtain good quality device layers. However, in all cases, whether or not a buffer layer is used and depending on the desired device properties (such as color of the emitted light), there still is a significant difference in lattice constants between the substrate and some of the AlGaInN device layers. This comes about because the lattice constant (as well as the electrical and optical properties) of a $(Al_xGa_{1-x})_yIn_{1-y}N$ layer changes with the molar ratios x and y. As a result, material quality issues are encountered similar to the ones with the growth on sapphire.

Generally, growing a buffer layer over the substrate allows good quality N-type and P-type device layers to be grown. But, when the N-doping of an AlGaInN device layer is increased above $2E18$ $cm^{-3}$ as measured by Hall effect (for instance for a Si-doped GaN layer within an LED), some of the device layers exhibit severe cracking when the highly-doped layer exceeds a few micrometers (μms) in thickness because of the large lattice mismatch and thermal expansion coefficient difference with the substrate. Prior art devices minimize cracking by using a thin layer when high doping is required or by lowering the doping when a thick layer is required. As the doping of a device layer increases, the thickness of the layer decreases to avoid cracking. However, a thick first device layer (typically 3–4 μms) is needed to maintain material quality while the high dopings can improve the electrical and optical performance of the device by lowering the N-contact resistance, the forward voltage, and the bulk resistance within the N-doped layers. Material cracking impacts device performance severely and affects reliability.

An LED having increased N-type doping in one or more device layers while having good material quality is a highly desirable feature for optimizing the electrical characteristics (e.g. forward voltage and series resistance). It would be further beneficial if the dopings could be further optimized to provide for improved carrier injection and pair recombination to improve light output efficiency.

SUMMARY OF THE INVENTION

N-type doping in III-V-nitride semiconductor compounds, i.e. GaN-based compounds such as GaN, AlGaN, AlInN, InGaN, or AlGaInN, can be optimized to improve N-contact electrical resistance, turn-on and forward voltages, minority carrier injection and recombination characteristics without inducing cracking of the device layers. This is achieved by fabricating a compound N-type device layer that has several sub-layers. For each desired electrical characteristic or property, there is a corresponding N-type doped sub-layer. The thickness of each sub-layer is carefully selected to avoid material cracking: the higher the required doping, the smaller the corresponding thickness.

For a light emitting device (LED), a compound N-type device layer has three sub-layers. The doping level of each sub-layer has been selected to optimize a selected physical property. The first sub-layer is undoped or lightly doped to avoid cracking and is grown to the desired thickness for good material quality. The second sub-layer is heavily doped to provide good N-contact, forward voltage, and electrical resistivity characteristics and is kept correspondingly as thin as necessary to avoid material cracking. The third sub-layer is doped to the desired level to provide optimum carrier injection and pair recombination in the active layer of the device: its doping is typically lower than the second sub-layer's, and correspondingly its thickness can be greater if so desired.

BRIEF DESCRIPTION OF THE DRAWINGS

FIG. 2 illustrates a fabrication process flow chart for the device shown in FIG. 1.

DETAILED DESCRIPTION OF THE PREFERRED EMBODIMENTS

Figure 1:
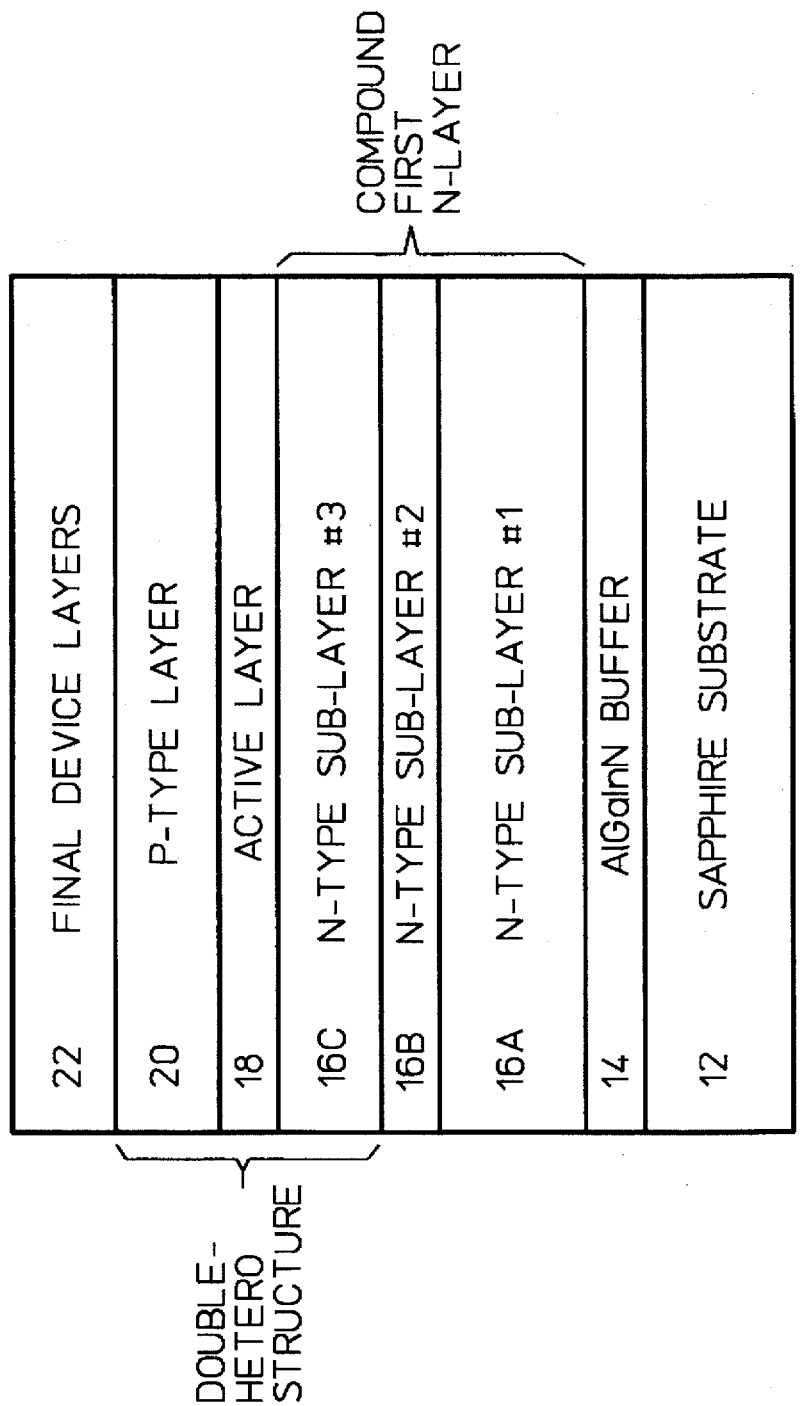
FIG. 1 illustrates a device of the present invention, where an N-type, compound layer is grown first.

FIG. 1 illustrates an N-type LED 10 of the present invention. An $(Al_xGa_{1-x})_yIn_{1-y}N$ buffer layer 14 is positioned on a substrate 12, such as a sapphire substrate. A compound device layer 16 of N-type AlGaInN is positioned over the AlGaInN buffer layer 14. A D(ouble)-H(etero) structure is formed from a device sub-layer 16C, and from an active layer 18 and a single or composite P-type layer 20 of AlGaInN compound-semiconductor grown over the compound device layer 16.

The compound device layer 16 has three sub-layers 16, 16B, and 16C of N-doped AlGaInN material, such as GaN:Si. Each sub-layer has a unique doping level. The first sub-layer 16A is lightly doped to avoid cracking and is grown to the desired thickness for good material quality. The doping level of the first sub-layer 16A may be $N_d$=2E18 cm$^{-3}$ (as measured by Hall effect) and the associated thickness may be 3.5 µm. The second sub-layer 16B is heavily doped to provide good N-contact, forward voltage, and electrical resistivity characteristics. The doping level of the second sub-layer 16B may be $N_d$=8E18 cm$^{-3}$ (as measured by Hall effect) and the associated thickness may be kept at or below 0.4 µm to avoid cracking. The optional third sub-layer 16C is doped to the desired level to provide optimum carrier injection and pair recombination in the active layer 18 of the device. The doping level of the third sub-layer 16C may be $N_d$=2E18 cm$^{-3}$ (as measured by Hall effect). The third sub-layer provides independent doping control for optimum current injection and recombination in light emitting double-hetero-structure devices, such as blue and green light emitting diodes (LEDs) and lasers (such as edge-emitting lasers and Vertical-Cavity-Surface-Emitting-LaserS).

FIG. 2 illustrates a process flow chart 30 for the device shown in FIG. 1. In step 40, the buffer layer is formed directly on the sapphire substrate. In step 50, the first N-type device sub-layer is formed directly on the buffer layer at growth temperatures that range from 300° C. to 1500° C., while the thickness of the first sub-layer may vary between 1.0 µm to 300 µm in thickness. In step 60, the second sub-layer is formed over the first sub-layer at comparable growth temperatures, while the thickness of the second sub-layer is typically 0.05 µm to 1.0 µm in thickness, with an N-type doping above 2E18 cm$^{-3}$ (as measured by Hall effect): the doping level is selected to optimize the electrical characteristics of the device and the thickness is kept thin enough to avoid cracking: the higher the sub-layer doping, the smaller the sub-layer thickness. In step 70, the optional third sub-layer is formed over the second sub-layer to a selected doping and thickness. The doping and thickness are selected to improve current injection and optical recombination. In step 80, the remaining device layers are formed over the composite device layer at a growth temperature that ranges from 300° C. to 1500° C.

The sub-layers may be grown using one of many available techniques such as organometallic vapor phase epitaxy (OMVPE) (also called metal-organic chemical vapor deposition (MOCVD), molecular beam epitaxy (MBE), gas source MBE (GSPMBE), or hydride vapor phase epitaxy (HVPE). The $(Al_xGa_{1-x})_yIn_{1-y}N$ sub-layers may or may not have the same chemical composition (i.e., same x and y molar ratios). The composition and/or doping of the sub-layers may change abruptly from one sub-layer to another, or may instead be smoothly graded over a finite thickness, or may be graded over the entire thickness of the sub-layers.

Although a compound N-type layer having three sub-layers has been illustrated to improve the following characteristics; N-contact electrical resistance, forward voltage, current injection, and radiative recombination, without inducing cracking of the device layers, additional N-type sub-layers may be added such that the composition, thickness, and doping level of each layer accommodates a desired electrical characteristic or physical property for the device. The compound structure is further extendible to alleviate cracking problems occurring in other, highly N-doped or P-doped layers sequences in semiconductor devices.

I claim:

1. A device comprising:
   a substrate;
   a compound device layer of $(Al_xGa_{1-x})_yIn_{1-y}N$, positioned over the substrate, including a first and second sub-layer, wherein each sub-layer has an associated composition, thickness, and doping level; and
   an active layer, positioned over the compound device layer;
   wherein the composition and thickness associated with each of the sub-layers is adjusted to minimize material cracking, for each sub-layer the doping level is inversely proportional to the thickness.

2. A device, as defined in claim 1, further comprising: a buffer layer interposing the substrate and the compound device layer.

3. A device, as defined in claim 2, the compound device layer further including a third sub-layer, having an associated doping and thickness, positioned over the second sub-layer, wherein the associated doping of the second and third sub-layers are independently adjusted, the doping of the second sub-layer is adjusted to minimize the electrical resistivity and forward voltage of the device under operation and the doping of the third sub-layer is adjusted to maximize the power output of the device.

4. A device, as defined in claim 1, wherein the associated doping level and thickness of the first sub-layer are further adjusted to minimize material dislocation and defect densities and the associated doping level of the second sub-layer is adjusted to minimize the electrical resistivity and device forward voltage.

5. A device, as defined in claim 4, wherein the associated doping level of the second sub-layer exceeds the associated doping level of the first sub-layer.

6. A device, as defined in claim 5, wherein the doping level changes continuously throughout the first and the second sub-layers.

7. A device, as defined in claim 6, wherein the composition changes continuously throughout the first and the second sub-layers.

8. A device, as defined in claim 5, wherein the composition changes continuously throughout from the first the second sub-layers.

9. A device, as defined in claim 5, wherein the ratio of the associated doping level of the first sub-layer to the associated doping level of the second sub-layer is between 1 and 100000.

10. A device, as defined in claim 4, the compound device layer further including a third sub-layer, having an associated doping and thickness, positioned over the second sub-layer, wherein the associated doping of the second and third sub-layers are independently adjusted, the doping of the second sub-layer is adjusted to minimize the electrical resistivity and forward voltage of the device under operation and the doping of the third sub-layer is adjusted to maximize the power output of the device.

11. A device, as defined in claim 1, wherein the compound device layer consists of P-type $(Al_xGa_{1-x})_yIn_{1-y}N$ material.

12. A device, as defined in claim 1, wherein the compound device layer consists of N-type $(Al_xGa_{1-x})_yIn_{1-y}N$ material.

13. A device, as defined in claim 12, wherein the associated doping level and thickness of the first sub-layer are further adjusted to minimize material dislocation and defect densities and the associated doping level of the second sub-layer is adjusted to minimize the electrical resistivity and device forward voltage.

14. A device, as defined in claim 13, wherein the associated doping level of the second sub-layer exceeds the associated doping level of the first sub-layer.

15. A device, as defined in claim 14, wherein the doping level changes continuously throughout the first and the second sub-layers.

16. A device, as defined in claim 14, wherein the composition changes continuously throughout the first and the second sub-layers.

17. A device, as defined in claim 14, wherein the ratio of the associated doping level of the first sub-layer to the associated doping level of the second sub-layer is between 1 and 10000.

18. A device, as defined in claim 13, the compound device layer further including a third sub-layer, having an associated doping and thickness., positioned over the second sub-layer, wherein the associated doping of the second and third sub-layers are independently adjusted, the doping of the second sub-layer is adjusted to minimize the electrical resistivity and forward voltage of the device under operation and the doping of the third sub-layer is adjusted to maximize the power output of the device.

19. A device, as defined in claim 18, wherein the associated doping level of the second sub-layer exceeds the associated doping level of the first sub-layer.

20. A device, as defined in claim 19, further comprising:

a buffer layer interposing the substrate and the compound device layer.

21. A device, as defined in claim 20, wherein the ratio of the associated doping level of the first sub-layer to the associated doping level of the second sub-layer is between 1 and 10000.

* * * * *